United States Patent
Neudorf et al.

(10) Patent No.: US 11,018,674 B1
(45) Date of Patent: May 25, 2021

(54) REDUCING RESOURCE REQUIREMENTS FOR HIGH-FREQUENCY COUNTER ARRAYS

(71) Applicant: Ciena Corporation, Hanover, MD (US)

(72) Inventors: Kenneth Edward Neudorf, Ottawa (CA); Stuart C. White, Ottawa (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 16/950,034

(22) Filed: Nov. 17, 2020

(51) Int. Cl.
*H03K 23/00* (2006.01)
*H03K 19/17724* (2020.01)
*H03K 19/17736* (2020.01)
*H03K 23/42* (2006.01)

(52) U.S. Cl.
CPC ....... *H03K 23/004* (2013.01); *H03K 19/1774* (2013.01); *H03K 19/17724* (2013.01); *H03K 23/42* (2013.01)

(58) Field of Classification Search
None
See application file for complete search history.

(56) References Cited

U.S. PATENT DOCUMENTS

| | | | |
|---|---|---|---|
| 7,317,725 B2 | 1/2008 | Etemadi et al. | |
| 7,391,721 B1* | 6/2008 | Holbrook | H03K 21/00 370/229 |
| 8,886,878 B1 | 11/2014 | Neudorf et al. | |
| 9,838,222 B2* | 12/2017 | Jorgensen | H04L 12/6418 |
| 2006/0265526 A1* | 11/2006 | Holbrook | H04L 49/9078 710/52 |
| 2008/0043899 A1* | 2/2008 | Gara | H03K 21/026 377/118 |
| 2011/0113190 A1* | 5/2011 | Acharya | H04L 69/12 711/108 |

* cited by examiner

*Primary Examiner* — Tuan T Lam
(74) *Attorney, Agent, or Firm* — Clements Bernard Walker; Lawrence A. Baratta, Jr.; Christopher L. Bernard

(57) ABSTRACT

Systems and method include receiving counter update requests that are at a maximum frequency of $f_{counters}$; sending the counter update requests to a main block of counters that operate at a maximum frequency of $f_{main}$, where $(f_{main}) \geq (f_{counters})/2$; and responsive to a block of the main block of counters experiencing an overflow, sending corresponding counter update requests for the block of the main block of counters experiencing the overflow to a cache counter block that operates at a maximum frequency of $f_{cache}$, where $(f_{main}) \geq (f_{cache})$ and $(f_{cache}) \geq (f_{counters}) - (f_{main})$. The counter update requests can be for Y×K total counters, and the main block of counters can include Y blocks of counters each block having K counters, Y and K are positive integers. $(f_{main}) \geq (f_{counters})/2$ ensures only one block of the main block of counters overflows simultaneously.

20 Claims, 2 Drawing Sheets

REDUCING RESOURCE REQUIREMENTS FOR HIGH-FREQUENCY COUNTER ARRAYS

FIELD OF THE DISCLOSURE

The present disclosure generally relates to electrical circuitry for updating high-frequency data. More particularly, the present disclosure relates to systems and methods for reducing resource requirements for high-frequency counter arrays.

BACKGROUND OF THE DISCLOSURE

As described herein, a counter value is some value that is updated in a high-frequency counter array. For example, the counter values can be associated with monitoring packet connections, such as 10 Gigabit Ethernet (GE), 100 GE, and higher rates. For example, the counter values can be packet counts for different services. Various types of counters are contemplated with the foregoing presented for illustration purposes. A key aspect of the counter values is they are updated frequently and at high-rates. Also, the terms counters and counter values may be used interchangeably herein. Currently, if a block of counters needs to be updated at a rate of M, then the counters themselves must be updated at rate M. If the counter runs at rate F, and F is <M, then multiple copies (N) of the counter must be used where N=ROUNDUP (M/F). For example, if counters need to be updated at 800 MHz, but the counter implementation can only run at 500 MHz, then N=ROUNDUP (800/500)=2 sets of counters need to be used to capture all the counter update requests coming in at 800 MHz. The incoming counter update requests would be distributed across both columns of counters.

This disconnect between counter update frequency and hardware operation rate has disadvantages in practical implementations. First, the number of counters is limited by device size. The cost of multiple counters, power requirements, routing complexity, and board space are all increased.

BRIEF SUMMARY OF THE DISCLOSURE

The present disclosure relates to systems and methods for reducing resource requirements for high-frequency counter arrays. In an embodiment, the present disclosure relates to a statistics circuit, e.g., an Application Specific Integrated Circuit (ASIC), Field Programmable Gate Array (FPGA), and the like, that is connected to switching circuitry (e.g., another ASIC, FPGA, a Network Processing Unit (NPU), etc.) for the purposes of statistics gathering, i.e., counters. The present disclosure is directed to a technique of organizing the statistics circuit to overcome the disconnect between counter update frequency and hardware operation rate. Advantageously, the present disclosure can reduce the size and internal power of the statistics circuit by up to 50%. Further, the present disclosure provides cost reduction as a smaller statistics circuit can be used for a given application. Also, the number of counters for a particular design can be increased for the same costs and power. Further, board space usage is reduced, giving board designers more flexibility for placement.

In an embodiment, a method includes receiving counter update requests that are at a maximum frequency of $f_{counters}$; sending the counter update requests to a main block of counters that operate at a maximum frequency of $f_{main}$, where $(f_{main}) \geq (f_{counters})/2$; and, responsive to a block of the main block of counters experiencing an overflow where the update rate to the main block of counters exceeds $f_{main}$, sending corresponding counter update requests for the block of the main block of counters experiencing the overflow to a cache counter block that operates at a maximum frequency of $f_{cache}$, where $(f_{main}) \geq (f_{cache})$ and $(f_{cache}) \geq (f_{counters}) - (f_{main})$. The counter update requests can be for Y×K total counters, and wherein the main block of counters includes Y blocks of counters each block having K counters, Y and K are positive integers. $(f_{main}) \geq (f_{counters})/2$ ensures only one block of the main block of counters overflows simultaneously.

The method can further include, subsequent to the block of the main block of counters experiencing the overflow and the sending the corresponding counter update requests to the cache counter block, determining a second block of the main block of counters is experiencing an overflow; and sending data in the cache counter block to the main block and sending corresponding counter update requests for the second block to the cache counter block. The method can further include converting a clock associated with the counter update requests to a clock associated with the main block of counters. The method can be performed in one of an Application Specific Integrated Circuit and a Field Programmable Gate Array (FPGA). The method can be performed in a statistics circuit connected to switching circuitry and the counter update requests are associated with monitoring for the switching circuitry. The counter update requests can be associated with monitoring packet services.

In another embodiment, a system includes circuitry configured to receive counter update requests that are at a maximum frequency of $f_{counters}$, send the counter update requests to a main block of counters that operate at a maximum frequency of $f_{main}$, where $(f_{main}) \geq (f_{counters})/2$, and, responsive to a block of the main block of counters experiencing an overflow, send corresponding counter update requests for the block of the main block of counters experiencing the overflow to a cache counter block that operates at a maximum frequency of $f_{cache}$, where $(f_{main}) \geq (f_{cache})$ and $(f_{cache}) \geq (f_{counters}) - (f_{main})$. The counter update requests can be for Y×K total counters, and wherein the main block of counters includes Y blocks of counters each block having K counters, Y and K are positive integers. $(f_{main}) \geq (f_{counters})/2$ ensures only one block of the main block of counters overflows simultaneously.

The system can further include circuitry configured to subsequent to the block of the main block of counters experiencing the overflow, determine a second block of the main block of counters is experiencing an overflow, and send data in the cache counter block to the main block and sending corresponding counter update requests for the second block to the cache counter block. The system can further include circuitry configured to convert a clock associated with the counter update requests to a clock associated with the main block of counters. The circuitry can include one of an Application Specific Integrated Circuit and a Field Programmable Gate Array (FPGA). The counter update requests can be associated with monitoring for switching circuitry. The counter update requests can be associated with monitoring packet services.

In a further embodiment, a statistics circuit includes update request router and overflow detection circuitry configured to receive counter update requests that are at a maximum frequency of $f_{counters}$; a main block of counters that operate at a maximum frequency of $f_{main}$, where $(f_{main}) \geq (f_{counters})/2$, each block is connected to the update request router and overflow detection circuitry; and a cache counter block that operates at a maximum frequency of $f_{cache}$, where $(f_{main}) \geq (f_{cache})$ and $(f_{cache}) \geq (f_{counters}) - (f_{main})$, wherein, responsive to a block of the main block of counters experiencing an overflow, corresponding counter update requests for the block experiencing the overflow are provided to the cache counter block. The counter update requests can be for Y×K total counters, and wherein the main block of counters includes Y blocks of counters each block having K counters, Y and K are positive integers. $(f_{main}) \geq (f_{counters})/2$ ensures only one block of the main block of counters overflows simultaneously. The statistics circuit can further include clock domain crossing circuitry between update request router and overflow detection circuitry, the main block of counters, and the cache counter block, and configured to perform clock conversions.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

Again, the present disclosure relates to systems and methods for reducing resource requirements for high-frequency counter arrays. In an embodiment, the present disclosure relates to a statistics circuit, e.g., an Application Specific Integrated Circuit (ASIC), Field Programmable Gate Array (FPGA), and the like, that is connected to switching circuitry (e.g., another ASIC, FPGA, a Network Processing Unit (NPU), etc.) for the purposes of statistics gathering, i.e., counters. The present disclosure is directed to a technique of organizing the statistics circuit to overcome the disconnect between counter update frequency and hardware operation rate. Advantageously, the present disclosure can reduce the size and internal power of the statistics circuit by up to 50%. Further, the present disclosure provides cost reduction as a smaller statistics circuit can be used for a given application. Also, the number of counters for a particular design can be increased for the same costs and power. Further, board space usage is reduced, giving board designers more flexibility for placement.

Figure 1:
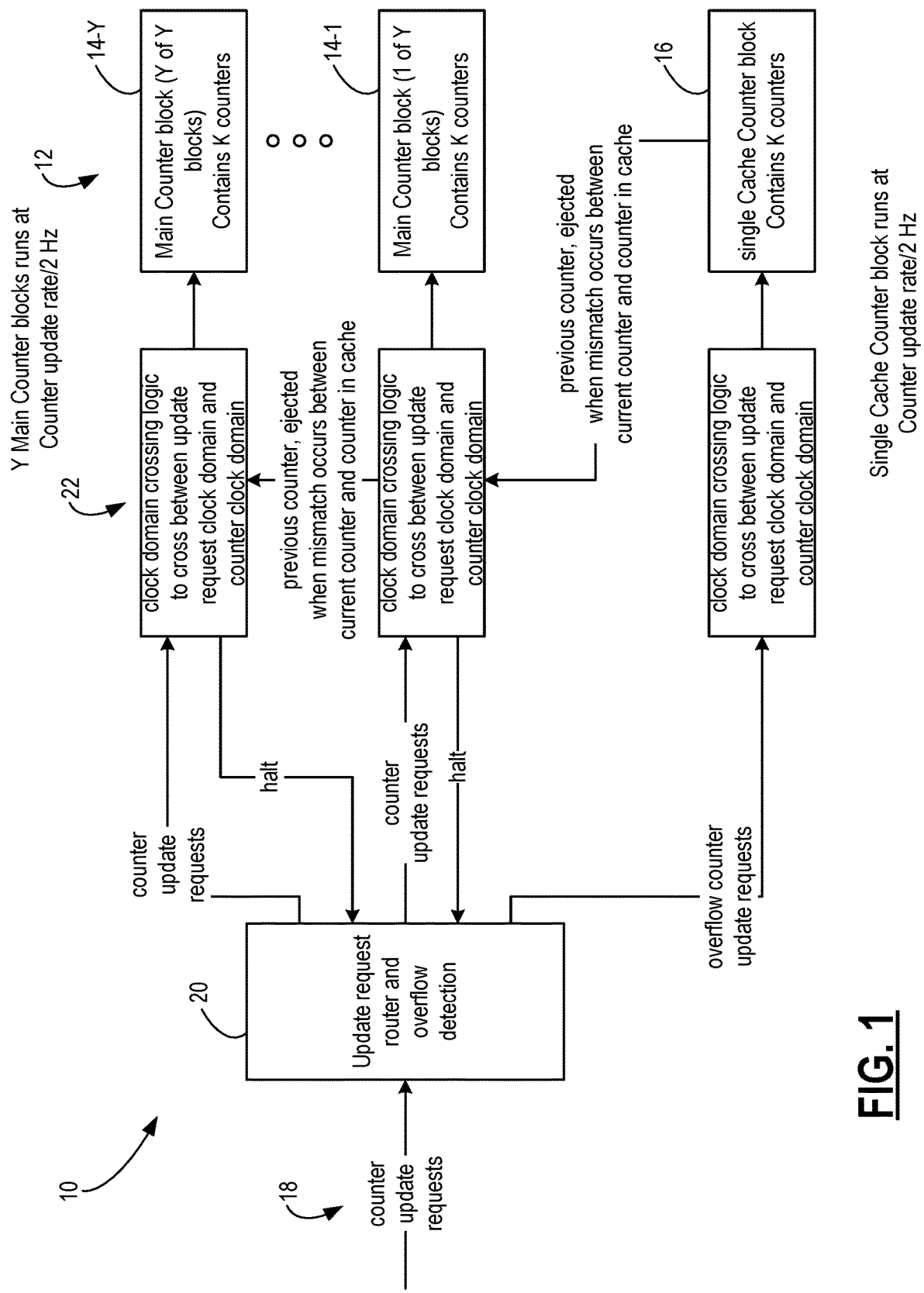
FIG. 1 is a functional block diagram of a statistics circuit with counters separated into various counter blocks and a cache counter block.

FIG. 1 is a functional block diagram of a statistics circuit 10 with counters 12 separated into various counter blocks 14-1-14-Y and a cache counter block 16. Again, the statistics circuit 10 is an ASIC, FPGA, etc., and it is configured to connect to switching circuitry for the purpose of monitoring, i.e., counter updates. The present disclosure includes a technique for reducing the amount of resources (by up to 50%) required to build a group of the counters 12 that must be updated at a rate ($f_{counters}$) that is higher than the maximum update rate ($f_{main}$) supported by any single counter ($f_{counters} > f_{main}$). As described herein, resources are hardware components in the statistics circuit 10. The technique is to break the total number of counters 12 into smaller blocks 14 of counters; each smaller block 14 must be the same size. For example, if the total number of counters 12 is 1000, this could be broken into 10 blocks 14 of 100 counters each. An overflow (cache) block 16 of counters that is the same size as the smaller block of counters is then added, i.e., in this example, there would be 11 blocks of 100 counters each. In FIG. 1, there are Y blocks 14-1-14-Y, each having K counters 12, for a total of Y×K counters 12 and one cache counter block 16 of K counters. Using the previous example, Y=10, K=100, and Y×K=1000. As described herein, an overflow is the situation where the update rate to the main block of counters exceeds $f_{main}$.

The value of Y can be selected based on the number of counters needed and the resources required. In this example, there are 10 blocks 14 of 100 counters each. There can be other approaches for selecting Y to partition the counters 12. That is, number of blocks 14 and size of the blocks 14 is arbitrary. As the number of blocks 14 grows, the size of the cache block 16 gets smaller, but the amount of logic around each block 14 stays the same, so the logic grows as the number of counter blocks grows. Accordingly, there is a trade off between how much logic in a device versus how much RAM in the same device. For example, if one wants the cache to be a very small percentage of the total RAM, then use a larger number of blocks 14. The cache size as a percent of total RAM=1/(1+num blocks). As the number of blocks 14 gets bigger, the cache percentage of total available RAM for counters goes down. The smallest size for the counter block 14 is usually the minimum size of one of the RAM blocks within the device, but if the counters were all in Flip Flops (logic based), the minimum block size could be a single counter, which means the cache would also only be a single counter.

In operation, counter update requests 18 are received in the statistics circuit 10 at an update request router and overflow detection block 20. As described herein, the blocks 14, 20 are electrical circuitry. The counter update requests 18 are received from an external circuit, i.e., a switching circuit (not shown in FIG. 1). The update request router and overflow detection block 20 connects to each of the blocks 14-1-14-Y and the cache counter block 16, via crossing logic 22. The crossing logic 22 is located between each counter block 14 and the update request router and overflow detection block 20. It is configured to perform a clock conversion as the counter blocks 14 operate at a different frequency than the counter update requests 12. Also, the cache counter block 16 connected to the counter blocks 14 via the crossing logic 22.

The present disclosure includes an architecture for the counter blocks 14 and the cache counter blocks 16 with the crossing logic 22 and the update request router and overflow detection block 20 to support a lower frequency in the counters 14. The idea is if one of the smaller counter blocks 14 cannot accept an update request 18, the cache counter block 16 will accept the update request 18. If the cache counter block 16 detects a counter collision (the counter to be updated in the cache counter block 16 is now receiving a counter value from a different main block 14 than is currently in the cache counter block 16), the counter value currently in the cache counter block 16 is sent back to the originating smaller counter block 14, via the crossing logic 22, to be added into the counter location in that smaller counter block 14.

For example, if the counter block 14-3 input First-In-First-Out (FIFO) overflows, the counter update request 18 for counter block 14-3 is sent to the cache counter block 16, via the update request router and overflow detection block 20. If the counter block 14-4 FIFO then overflows, the counter block 14-4's update request 18 also goes to the cache counter block 16. If the counter block 14-4 update request to the cache counter block 16 goes to the same location in the cache counter block 16 as the previous counter block 14-3 request, then the data in the cache counter block 16 for counter block 14-3 is removed and sent back to the counter block 14-3 input FIFO, via the crossing logic 22, where it is added to the data in the counter block 14-3. The counter block 14-3 has the bandwidth to accept the update request 18 as its input FIFO is no longer the one sending overflow requests to the cache counter block 16.

The counter blocks 14-1-14-Y can be referred to as a main counter block relative to the cache counter block 16. One requirement in the statistics circuit 10 is the operating frequency of the main counter block ($f_{main}$) is greater than or equal to the operating frequency of the cache counter block 16 ($f_{cache}$). Also, the bandwidth, i.e., the operating frequency of the main counter block ($f_{main}$) must be greater than or equal to the maximum update rate of the counter update requests 18 ($f_{counters}$) divided by 2. To summarize these two requirements—

$$(f_{main}) \geq (f_{cache}) \quad (1)$$

$$(f_{main}) \geq (f_{counters})/2 \quad (2)$$

$$(f_{cache}) \geq (f_{counters}) - (f_{main}) \quad (3)$$

Equation (3) sets the minimum cache frequency. This is required to ensure that the cache can absorb all overflows if all counter updates are going to a single block 14. Equation (2) ensures no two [main] counter blocks can overflow simultaneously. This is because the acceptance rate of two blocks 14 is always $\geq f_{counter}$, a single counter block 14 can overflow due to the fact that the acceptance rate of a single block 14 is <M. That is, partitioning the Y×K counters into Y blocks is a similar strategy as doubling up the overall counters in the prior approaches. But this partitioning does not require twice the resources, i.e., the partitioning is done using existing resources and all that is added is the cache counter block 16.

Any collision in the cache counter block 16 can be accepted by the destination counter block 14 because the destination counter block 14 will never be in the overflow state at the same time as any other counter block 14, since only one block 14 can be in the overflow state at a time.

This technique saves resources because, normally, if the counter update rate is greater than the maximum counter frequency, counters are added in parallel to accept the faster update rate. In the conventional approach, the number of parallel counters to be added $$(C) = \text{ROUNDUP}(f_{counter}/f_{main}).$$

For example, if $f_{counter} = 1.5$ GHz and $f_{main}$ is 500 MHz, C=1500/500=3. Three copies of each counter would be required to support the update rate of 1.5 GHz, each running at 500 MHz.

Using the present disclosure, the # of parallel counters will be reduced to $$(C) = \text{ROUNDUP}(f_{counter}/2/f_{main}).$$

$$= \text{ROUNDUP}(1500/2/500)$$

$$= 2$$

The amount of resources required to build the counter blocks 14 would be reduced by ⅓ minus the resources to build a single cache counter block 16, and this single cache counter block 16 is much smaller than the 33% reduction in resources saved using the present disclosure.

In another example, if $f_{counter}=1.35$ GHz and $f_{main}$ is 700 MHz. Currently this design would require C=ROUNDUP (1.35/0.7)=2 sets of counters blocks. Using the present disclosure, the new C=ROUNDUP (1.35/2/0.7)=1 set of counter blocks. In this example, 50% of the resources required to build the same size counter array are saved. And again, only a single cache counter block needs to be added to save this 50% of resources.

Accordingly, the present disclosure includes partitioning of the counters 12 into blocks 14 and switching in a temporary small cache counter block 16 to handle the excess update requests 18 when the main counter block 14 cannot handle the update requests. The present disclosure includes a determination of the correct frequency relationship between the cache counter block 16 and the main counter blocks 14. The main counter blocks 14 must run at a frequency≥50% of the maximum counter update request rate 18 so collisions only affect a single main counter block 14. This can reduce power requirements by up to 50% as well. Running both the cache counter block 16 and main counter blocks 14 at least at the same frequency guarantees only one main counter block 14 will ever overflow at a time (i.e., only one of the blocks 14-1-14-Y). Given the fact that only one main counter block 14 can overflow at a time, using a single cache counter block 16 to deal with the overflow state of all counter blocks 14 allows the required number of main counter blocks 14 to be reduced by 33-50%.

Figure 2:
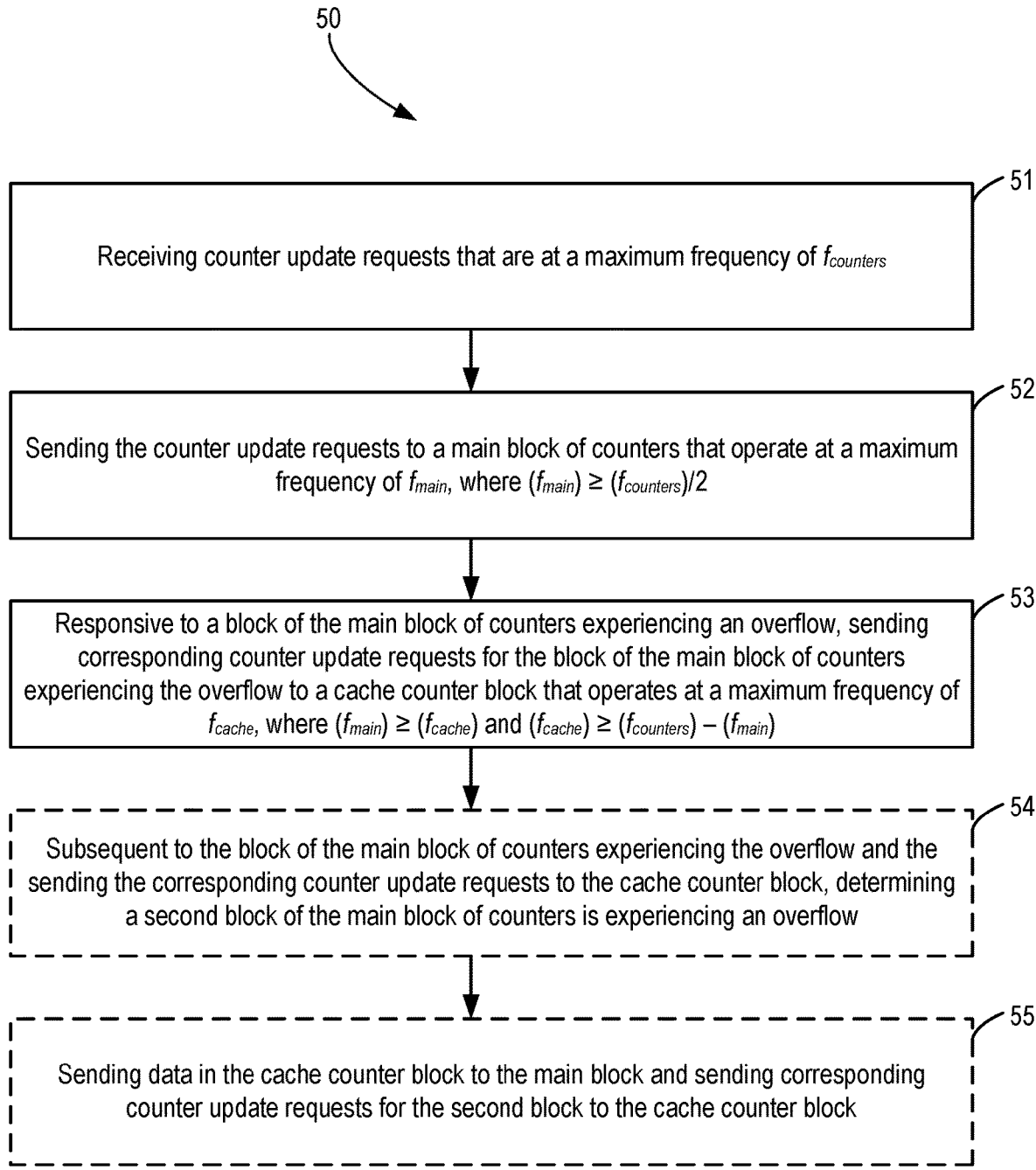
FIG. 2 is a flowchart of a counter update process.

FIG. 2 is a flowchart of a counter update process 50. The counter update process 50 includes receiving counter update requests that are at a maximum frequency of $f_{counters}$ (step 51); sending the counter update requests to a main block of counters that operate at a maximum frequency of $f_{main}$, where $(f_{main}) \geq (f_{counters})/2$ (step 52); and, responsive to a block of the main block of counters experiencing an overflow, sending corresponding counter update requests for the block of the main block of counters experiencing the overflow to a cache counter block that operates at a maximum frequency of $f_{cache}$, where $(f_{main}) \geq (f_{cache})$ and $(f_{cache}) \geq (f_{counters}) - (f_{main})$ (step 53).

The counter update requests can be for Y×K total counters, and the main block of counters can include Y blocks of counters each block having K counters, Y and K are positive integers. $(f_{main}) \geq (f_{counters})/2$ ensures only one block of the main block of counters overflows simultaneously.

The counter update process 50 can further include, subsequent to the block of the main block of counters experiencing the overflow and the sending the corresponding counter update requests to the cache counter block, determining a second block of the main block of counters is experiencing an overflow (step 54); and sending data in the cache counter block to the main block and sending corresponding counter update requests for the second block to the cache counter block (step 55). The counter update process 50 can further include converting a clock associated with the counter update requests to a clock associated with the main block of counters.

The counter update process 50 can be performed in one of an Application Specific Integrated Circuit and a Field Programmable Gate Array (FPGA). The counter update process 50 can be performed in a statistics circuit connected to switching circuitry and the counter update requests are associated with monitoring for the switching circuitry. The counter update requests can be associated with monitoring packet services.

In another embodiment, a system includes circuitry configured to receive counter update requests that are at a maximum frequency of $f_{counters}$; send the counter update requests to a main block of counters that operate at a maximum frequency of $f_{main}$, where $(f_{main}) \geq (f_{counters})/2$; and, responsive to a block of the main block of counters experiencing an overflow, send corresponding counter update requests for the block of the main block of counters experiencing the overflow to a cache counter block that operates at a maximum frequency of $f_{cache}$, where $(f_{main}) \geq (f_{cache})$ and $(f_{cache}) \geq (f_{counters}) - (f_{main})$.

In a further embodiment, a statistics circuit includes update request router and overflow detection circuitry configured to receive counter update requests that are at a maximum frequency of $f_{counters}$; a main block of counters that operate at a maximum frequency of $f_{main}$, where $(f_{main}) \geq (f_{counters})/2$, each block is connected to the update request router and overflow detection circuitry; and a cache counter block that operates at a maximum frequency of $f_{cache}$, where $(f_{main}) \geq (f_{cache})$ and $(f_{cache}) \geq (f_{counters}) - (f_{main})$, wherein, responsive to a block of the main block of counters experiencing an overflow, corresponding counter update requests for the block experiencing the overflow are provided to the cache counter block.

It will be appreciated that some embodiments described herein may include or utilize one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field-Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application-Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured to," "logic configured to," etc. perform a set of operations, steps, methods, processes, algorithms, functions, techniques, etc. on digital and/or analog signals as described herein for the various embodiments.

Moreover, some embodiments may include a non-transitory computer-readable medium having instructions stored thereon for programming a computer, server, appliance, device, one or more processors, circuit, etc. to perform functions as described and claimed herein. Examples of such non-transitory computer-readable medium include, but are not limited to, a hard disk, an optical storage device, a magnetic storage device, a Read-Only Memory (ROM), a Programmable ROM (PROM), an Erasable PROM (EPROM), an Electrically EPROM (EEPROM), Flash memory, and the like. When stored in the non-transitory computer-readable medium, software can include instructions executable by one or more processors (e.g., any type of programmable circuitry or logic) that, in response to such execution, cause the one or more processors to perform a set of operations, steps, methods, processes, algorithms, functions, techniques, etc. as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A method comprising:
receiving counter update requests that are at a maximum frequency of $f_{counters}$;
sending the counter update requests to a main block of counters that operate at a maximum frequency of $f_{main}$, where $(f_{main}) \geq (f_{counters})/2$; and
responsive to a block of the main block of counters experiencing an overflow, sending corresponding counter update requests for the block of the main block of counters experiencing the overflow to a cache counter block that operates at a maximum frequency of $f_{cache}$, where $(f_{main}) \geq (f_{cache})$ and $(f_{cache}) \geq (f_{counters}) - (f_{main})$.

2. The method of claim 1, wherein the counter update requests are for Y×K total counters, and wherein the main block of counters includes Y blocks of counters each block having K counters, Y and K are positive integers.

3. The method of claim 1, wherein $(f_{main}) \geq (f_{counters})/2$ ensures only one block of the main block of counters overflows simultaneously.

4. The method of claim 1, further comprising
subsequent to the block of the main block of counters experiencing the overflow and the sending the corresponding counter update requests to the cache counter block, determining a second block of the main block of counters is experiencing an overflow; and
sending data in the cache counter block to the main block and sending corresponding counter update requests for the second block to the cache counter block.

5. The method of claim 1, further comprising
converting a clock associated with the counter update requests to a clock associated with the main block of counters.

6. The method of claim 1, wherein the method is performed in one of an Application Specific Integrated Circuit and a Field Programmable Gate Array (FPGA).

7. The method of claim 1, wherein the method is performed in a statistics circuit connected to switching circuitry and the counter update requests are associated with monitoring for the switching circuitry.

8. The method of claim 1, wherein the counter update requests are associated with monitoring packet services.

9. A system comprising:
circuitry configured to
receive counter update requests that are at a maximum frequency of $f_{counters}$,
send the counter update requests to a main block of counters that operate at a maximum frequency of $f_{main}$, where $(f_{main}) \geq (f_{counters})/2$, and
responsive to a block of the main block of counters experiencing an overflow, send corresponding counter update requests for the block of the main block of counters experiencing the overflow to a cache counter block that operates at a maximum frequency of $f_{cache}$, where $(f_{main}) \geq (f_{cache})$ and $(f_{cache}) \geq (f_{counters}) - (f_{main})$.

10. The system of claim 9, wherein the counter update requests are for Y×K total counters, and wherein the main block of counters includes Y blocks of counters each block having K counters, Y and K are positive integers.

11. The system of claim 9, wherein $(f_{main}) \geq (f_{counters})/2$ ensures only one block of the main block of counters overflows simultaneously.

12. The system of claim 9, further comprising circuitry configured to
  subsequent to the block of the main block of counters experiencing the overflow, determine a second block of the main block of counters is experiencing an overflow, and
  send data in the cache counter block to the main block and sending corresponding counter update requests for the second block to the cache counter block.

13. The system of claim 9, further comprising circuitry configured to
  convert a clock associated with the counter update requests to a clock associated with the main block of counters.

14. The system of claim 9, wherein the circuitry includes one of an Application Specific Integrated Circuit and a Field Programmable Gate Array (FPGA).

15. The system of claim 9, wherein the counter update requests are associated with monitoring for switching circuitry.

16. The system of claim 9, wherein the counter update requests are associated with monitoring packet services.

17. A statistics circuit comprising:
  update request router and overflow detection circuitry configured to receive counter update requests that are at a maximum frequency of $f_{counters}$;
  a main block of counters that operate at a maximum frequency of $f_{main}$, where $(f_{main}) \geq (f_{counters})/2$, each block is connected to the update request router and overflow detection circuitry; and
  a cache counter block that operates at a maximum frequency of $f_{cache}$, where $(f_{main}) \geq (f_{cache})$ and $(f_{cache}) \geq (f_{counters}) - (f_{main})$, wherein, responsive to a block of the main block of counters experiencing an overflow, corresponding counter update requests for the block experiencing the overflow are provided to the cache counter block.

18. The statistics circuit of claim 17, wherein the counter update requests are for Y×K total counters, and wherein the main block of counters includes Y blocks of counters each block having K counters, Y and K are positive integers.

19. The statistics circuit of claim 17, wherein $(f_{main}) \geq (f_{counters})/2$ ensures only one block of the main block of counters overflows simultaneously.

20. The statistics circuit of claim 17, further comprising clock domain crossing circuitry between update request router and overflow detection circuitry, the main block of counters, and the cache counter block, and configured to perform clock conversions.

* * * * *